United States Patent [19]
Doyle

[11] Patent Number: 5,410,311
[45] Date of Patent: Apr. 25, 1995

[54] VOLTAGE REFERENCE AND CURRENT SOURCE FOR VIDEO DAC

[75] Inventor: Bruce A. Doyle, Richardson, Tex.

[73] Assignee: Pixel Semiconductor, Inc., Plano, Tex.

[21] Appl. No.: 99,158

[22] Filed: Jul. 29, 1993

[51] Int. Cl.⁶ .............................................. H03M 1/66
[52] U.S. Cl. .................... 341/144; 323/313; 323/314; 327/543
[58] Field of Search ............... 323/226, 312, 313, 315, 323/314; 341/136, 144, 153; 307/296.6, 296.8

[56] References Cited

U.S. PATENT DOCUMENTS

| | | | |
|---|---|---|---|
| 3,823,332 | 7/1974 | Feryszka et al. | 323/313 |
| 3,995,304 | 11/1976 | Pease | 341/153 |
| 4,814,686 | 3/1989 | Watanabe | 323/313 |
| 4,990,797 | 2/1991 | Real et al. | 323/315 |
| 5,017,919 | 5/1991 | Hull et al. | 341/136 |
| 5,144,384 | 10/1992 | Gotoh et al. | 341/136 |
| 5,313,300 | 5/1994 | Rabile | 341/144 |

Primary Examiner—Howard L. Williams
Attorney, Agent, or Firm—Winstead Sechrest & Minick

[57] ABSTRACT

There is disclosed a circuit and method for providing a reference voltage to a matrix array of video DAC cells. The circuit is located substantially within a center of the matrix array in order to minimize any effects upon the delivered reference voltage that process variations within the integrated circuit supporting the video DAC may produce. The center location minimizes the average distance between the voltage reference circuit and each of the DAC cells within the matrix array. In a preferred embodiment, the circuit is divided so that a reference voltage supplied by one portion of the circuit is unaffected by inherent capacitances within the MOSFET devices utilized within the circuit coupling that voltage reference to the other reference voltages supplied by the second portion of the circuit. In another preferred embodiment, the circuit is supplied with a current from an external current source, the external current produced by an external voltage and an external precision resistor whereby the external current is regulated by comparing the external voltage to a second reference voltage produced by the external current, wherein the regulation of the external circuit is accomplished with a circuit utilizing an N-channel device in order to reference the external current to ground and not to a noisy voltage supply.

64 Claims, 4 Drawing Sheets

# VOLTAGE REFERENCE AND CURRENT SOURCE FOR VIDEO DAC

CROSS REFERENCE

Co-pending patent application entitled "Method and System for Achieving Full Monotonic Signal Conversion," Ser. No. 08/099,835, filed concurrently herewith and assigned to a common assignee is hereby incorporated by reference herein.

TECHNICAL FIELD OF THE INVENTION

The present invention relates in general to voltage reference circuits, and in particular, to voltage reference circuits for digital to analog converters.

BACKGROUND OF THE INVENTION

The technology for producing integrated circuits ("ICs") continues to rapidly advance resulting in increasing circuit miniaturization and an increasing number of devices per chip ("chip density"). These devices commonly require steady current and voltage sources in order to operate effectively.

In certain prior art devices, constant reference voltages and currents are provided to devices on the IC through use of an external voltage source and an external precision resistor to supply a current to a reference circuit on the IC, which subsequently provides a constant current for each of the devices on the IC. The ideal result is steady voltages and currents supplied to each and every device within the IC that are equal to precisely the voltages and currents required by each one of these devices.

One problem with such a configuration is that with the currently available processes utilized to produce integrated circuits, such as with MOS technology, processing variations result in inconsistencies between devices located on different areas of the same IC. Thus, a reference circuit produced on one part of the IC may end up supplying different current and voltage magnitudes to different portions of the IC because of variations within the IC structure that result from the particular process that produced the IC. Furthermore, as the chip density increases and the devices become smaller and smaller, processing variations become a greater factor in the operation of the devices in conjunction with each other.

Other factors that may result in variations across the same IC are the different processes utilized to construct the different layers, or sections, of the IC (e.g. evaporation, deposition, etc.), differing angles within the wafer and the differing temperatures utilized in the various processes.

A separate problem that may arise is chip noise. Often, the major implementation within the IC is for digital circuitry, which commonly generates an immense amount of noise. The reference circuits utilized within the IC are analog circuits which require power supplies which are very quiet. Thus, noise from the digital circuitry often interferes with the function of the analog circuits constructed on the same chip.

The above problems are compounded within the implementation of a digital to analog circuit ("DAC"), since a DAC requires a plurality of energy (commonly, current) sources that produce the analog signal that is outputted from the DAC. Precision within the DAC is necessary so that the outputted analog signal is uniform and smooth throughout the digital to analog conversion process. Thus, it is necessary that the various energy sources utilized throughout the DAC and located throughout the IC on which the DAC is implemented are supplied with steady and uniform reference voltages and currents. In other words, an energy source residing in one portion of the DAC must be supplied with the same reference voltages and currents as are supplied to an energy source in another "distant" portion of the DAC.

Thus, there is a need for an implementation of reference voltage and current sources within an IC that are able to supply stable and uniform reference voltages and currents to all portions of the IC despite process variations within the IC.

There is also a need for a reference source within an IC that is immune to the noise produced by digital circuitry within the IC.

There is yet a further need for steady uniform reference voltages and currents to be supplied to all energy sources within a DAC.

SUMMARY OF THE INVENTION

It is therefore a primary object of the present invention to provide a voltage reference circuit that is capable of providing a reference voltage to all portions of a DAC, the reference voltage supplied to the DAC portions being stable and consistent and independent of any process variations inherent within the IC supporting the DAC.

In the attainment of the above-noted primary object, the present invention constructs a plurality of cell arrays each requiring power and incorporates a voltage reference circuit within the center of each such cell array within the DAC in order to minimize the average distance between the voltage reference circuit and each cell within the DAC.

The voltage reference circuit is utilized in conjunction with an external precision resistor and some additional internal circuitry to generate a precision on-chip current. This current is subsequently converted to a required reference voltage, which is then transmitted to each DAC cell on the IC. The current to voltage conversion is done in a reference circuit positioned central to the DAC cells on the IC so that any variation in processing parameters for the reference circuit are consistent with those of the DAC cells. This arrangement insures that each DAC cell obtains consistent and stable reference voltages by mitigating the effect of process variation differences between the reference circuit and the DAC cells. This is done in order to produce cell output currents that are consistent throughout the matrix array.

In a preferred embodiment of the present invention, a voltage reference circuit is located within each of three matrix arrays within a video DAC. The three matrix arrays provides digital to analog conversion of a red, a green and a blue channel comprising a video signal that is being converted within the video DAC.

In another preferred embodiment of the present invention the voltage reference circuit is divided into two separate circuits in order that the reference voltages supplied to the DAC cells are isolated from one another in order to remove coupling between the reference voltages as a result of inherent capacitances within the p-channel devices employed within the DAC cells. These inherent capacitances are a result of gate-tosource and gate-to-drain capacitances within the p-channel devices.

In yet another preferred embodiment of the present invention, the internal precision current, which is used in the voltage reference circuit, employs n-channel devices instead of p-channel devices in order to provide better noise isolation from the power supply providing power to the current source. The n-channel device references the produced current to a ground source instead of to a power supply source.

One technical advantage of the present invention is that a voltage reference circuit is located substantially within the center of a matrix array of DAC cells in order to minimize the average distance between the voltage reference circuit and each of the DAC cells so that any process variations inherent within the IC supporting the matrix array are minimized.

Another technical advantage of the present invention is that a voltage reference circuit is located substantially within the center of each of the matrix arrays within a video DAC, each array providing a digital to analog conversion of either the red, the green or the blue channels of the video signal. This configuration further minimizes any effects from process variations since each matrix array has its own reference voltage circuit located substantially within its center.

Yet another technical advantage of the present invention is the division of the voltage reference circuit into two separate legs in order to isolate the different reference voltages produced within the circuit from each other in order to prevent coupling between the reference voltages resulting from inherent capacitances within the p-channel devices employed within the voltage reference circuit.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 10:
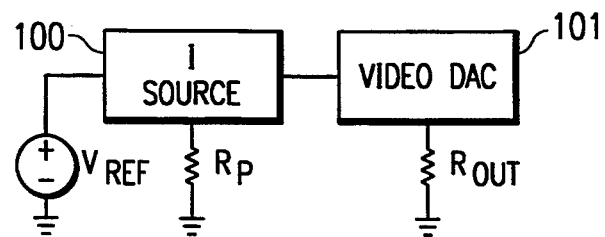
FIG. 10 illustrates a prior art configuration for providing a voltage reference to a video DAC.

Before beginning the discussion of the present invention, it may be helpful to briefly review the prior art. Turning first to FIG. 10, there is illustrated a prior art implementation for providing steady reference currents (or voltages) to devices on an IC, which in this case implements video DAC 101. Video DAC 101 is a digital to analog converter for transforming digital video signals to analog video signals that are outputted from video DAC 101 through $R_{OUT}$.

Video DAC 101 is supplied a reference current from I (current) source 100 using external voltage reference source $V_{REF}$ and precision resistor Rp in a manner well known in the art. The current received from current source 100 will be utilized by "on-board" (located within the IC) devices within video DAC 101 to provide various reference voltages and currents to the various devices within video DAC 101.

As described within the aforementioned patent application Ser. No. 08/099,835, a matrix array of energy sources is utilized within video DAC 101 to convert an inputted video digital signal to an analog signal through the various energy sources implemented within the matrix array.

The output voltage from DAC 101 is used to drive a monitor or CRT, which may be associated with a computer, television, videophone or any other apparatus that utilizes a video display. The varying levels of voltage dropped across $R_{OUT}$ on the output of DAC 101 provide different brightness and/or color levels for each pixel within the display. The varying voltage levels are attained by sending varying amounts of current through output resistor $R_{OUT}$. The varying current amounts are obtained by enabling, or activating, a varying number of DAC bits using an internal decoder circuit. The DAC bits depend upon reference voltages and currents from a reference source, which is energized by current source 100. Note that the output of DAC 101 may be dependent upon a form of energy other than current.

Commonly, with prior art ICs, there have been problems associated with the correlation of the various devices within an IC, especially with respect to MOS technology. Most notably, the prior art has traditionally separated on an IC die the reference circuit from the matrix arrays of DAC 101. Variations in the die between the on-board reference circuit and the devices within video DAC 101 eventually cause erroneous outputs to be presented from DAC 101 to an attached monitor. Additionally, there is a problem with interaction between the decoder circuit within DAC 101, which is a digital circuit, and the DAC matrix cells and their associated current sources in that they are analog circuits. Noise from the digital circuit can be injected into the analog circuits, i.e. the on-board reference circuit and the video DAC bits cause erroneous data to be presented to the monitor.

As will be discussed later with respect to FIG. 3, video DAC 101 may contain several separate matrix arrays, each requiring reference voltages and currents. The prior art has utilized a single set of devices located in one portion of video DAC 101 to supply the entire video DAC 101 and its various matrix arrays, with the required reference voltages and currents. Because of the variations throughout the IC implementing video DAC 101, which result from the processing and production of video DAC 101, the reference supply devices located in one portion of video DAC 101 will not supply steady and uniform voltages throughout video DAC 101 because of the variations throughout the IC. The present invention addresses this problem and others as will be subsequently described.

Figure 1:
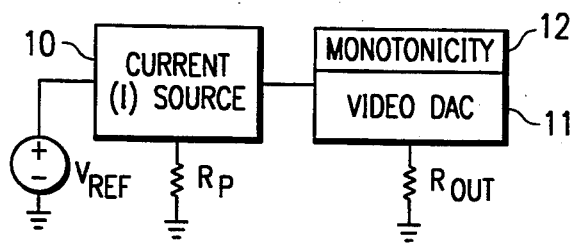
FIG. 1 illustrates an improved video DAC circuit utilizing the concepts of the present invention.

Turning now to FIG. 1, video DAC 11 is illustrated as an improvement of prior art video DAC circuit 101 utilizing the concepts of the present invention. Current source 10, external voltage source $V_{REF}$ and external precision resistor Rp generate a precision current for use by DAC 11 and monotonicity circuit 12. This precision current is utilized by a voltage reference circuit to produce reference voltages used in cells within video DAC 11 to produce accurate current levels via output resistor $R_{OUT}$.

The current outputted from DAC 11 is proportional and dependent upon digital code signals inputted into DAC 11 through monotonicity circuit 12. The outputted current is employed to produce video images on a monitor (not shown) in the preferred embodiment of the present invention.

Control of the DAC cells (bits) within video DAC 11 is accomplished through the use of monotonicity circuit 12. The purpose of monotonicity circuit 12 is to activate the appropriate cells within video DAC 11 in a fashion that provides a linear monotonic switching voltage across output resistor $R_{OUT}$.

Monotonicity circuit 12 which is envisioned for use in this system is shown in the aforementioned patent application Ser. No. P3510-P13US.

Figure 2:
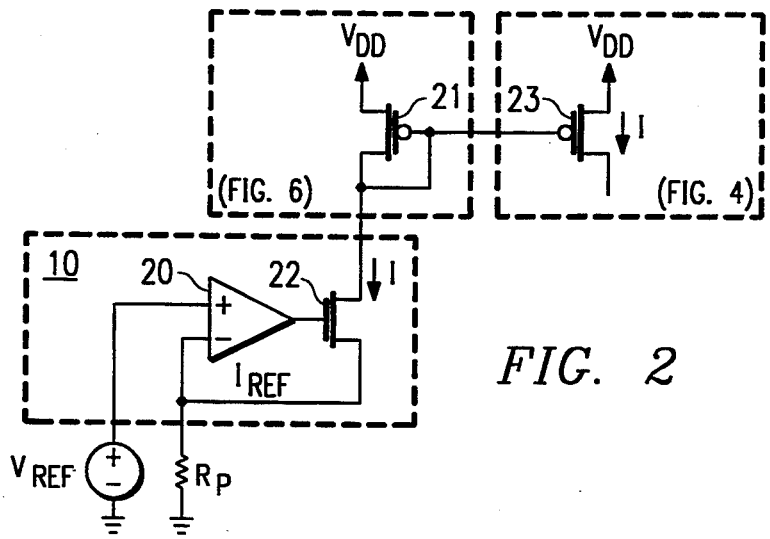
FIG. 2 illustrates a circuit diagram of a current source, and ideal circuit configurations for a voltage reference circuit and a DAC cell.

Referring next to FIG. 2, there is illustrated a more detailed view of current source 10 supplying a current I to device 21, which is representative of the on-board reference source within the IC supporting circuit 12 and DAC 11, and device 23, which is representative of a cell within a matrix array within DAC 11. These circuits will be further discussed below with respect to FIGS. 4 and 6. Voltage reference $V_{REF}$ and precision resistor Rp are used in conjunction with comparator 20 to produce a steady, precision current I, which is well known in the art.

However, a novel variation of circuit 10 has been implemented. Comparator 20 is made to drive n-channel device 22 rather than a p-channel device as is done within the prior art. The benefit of this novel configuration is better power supply rejection through the use of n-channel device 22 rather than through a p-channel device. Essentially, by using an n-channel device, current I is referenced to a ground level rather than a $V_{DD}$ level.

$V_{DD}$ is the off-chip supply, which is a system voltage coming from a power source. $V_{DD}$ is inherently a noisy supply, whereas ground is, in general, much more constant and less noisy.

By using n-channel device 22 as opposed to a p-channel device, the noise usually induced through a p-channel device is eliminated. This provides a more constant current I to the IC chip supporting DAC 11 and circuit 12.

To convert the current I to reference voltages for use by devices within circuits 11 and 12, device 21 is used, which is a p-channel device connecting $V_{DD}$ to device 22 within current source 10. Current I is then mirrored in device 23 through the coupling of devices 21 and 23.

Device 21 is representative of an actual DAC voltage reference circuit which is used to generate reference voltages in the DAC used by the DAC bits.

Device 23 is representative of an actual DAC bit (cell) within DAC array I1, the result is that the current I generated from comparator 20 is controlled through device 22 and mirrored through device 21 into device 23 to provide current I through the DAC bit (detailed in FIG. 4) in DAC array 11.

As previously noted, circuit 10 is an exploded view of I Source, which is similar to circuit 10 from FIG. 1, except for the novel use of n-channel device 22. Additionally, there is device 21, which is implemented in the actual circuit shown in FIG. 6. There is also device 23 which is implemented in circuit 40 shown in FIG. 4. Devices 21 and 23 are ideal views of how the current source interacts with DAC 11.

Figure 3:
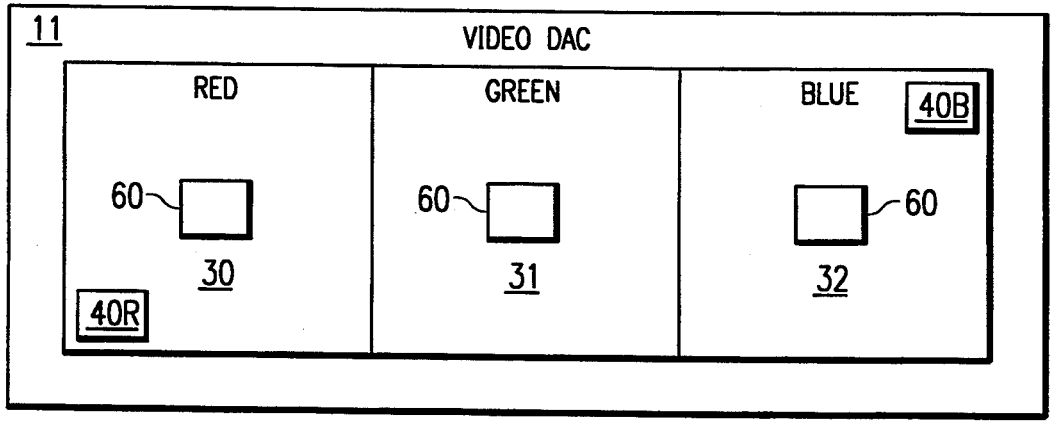
FIG. 3 illustrates a block diagram of a video DAC employing the voltage reference circuit of the present invention.

Referring next to FIG. 3, there is illustrated a block-level representation of the matrices of cells, or bits, within video DAC 11. In the preferred embodiment, there are three color channels converted within video DAC 11: a red channel, a green channel and a blue channel. These three channels are converted from digital signals to analog signals through three separate arrays 30, 31 and 32, respectively. Within each of arrays 30, 31, 32 there are a plurality of DAC bits (only DAC bits 40R and 40B are shown; however, arrays 30, 31, 32 may contain any number of additional DAC bits) which are controlled by monotonicity circuit 12 such that a determined amount of current is switched to output $R_{OUT}$ (an $R_{OUT}$ will be present for each of arrays 30, 31, 32) depending on the desired color to present to each pixel within the video screen. In general, the higher the current the more intense the associated color becomes for a given pixel. As an image is "painted" on a screen, the current levels to each cell change constantly to achieve the desired video color image.

Figure 6:
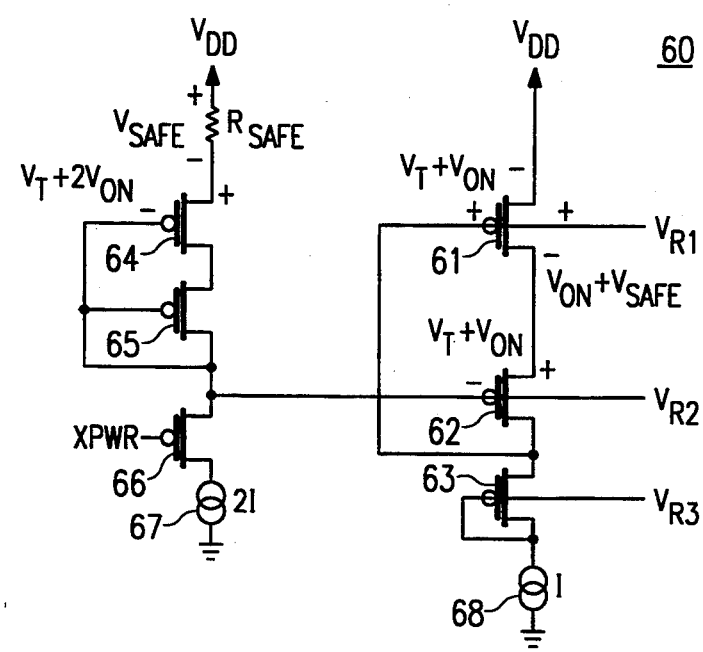
FIG. 6 illustrates a circuit diagram of the voltage reference circuit.

Reference circuit 60, which is detailed in FIG. 6, is positioned at the approximate center of each of arrays 30, 31, and 32. Circuit 60 is the current generator used within each DAC array 30, 31, 32 to convert voltages from current source 10 to voltages used in each of the DAC bits within arrays 30, 31 32 to provide the required output current from each of arrays 30, 31, 32.

The reason for placing circuit 60 in the middle of each DAC array 30, 31, 32 is to minimize the variation between the current produced in reference circuit 60 with the current flowing through any particular DAC bit within arrays 30, 31, 32. As previously described with reference to FIG. 2, the coupling between reference circuit 60 and a DAC bit results in a mirroring of their currents.

An example is illustrated with DAC bits 40R and 40B. Reference circuit 60 is placed substantially in the center of each DAC array 30, 31, 32 so that each array has its own set of reference voltages. This center placement of circuit 60 ensures that during processing and production of DAC 11 that the various devices in circuit 60 are as close in proximity as possible to devices within DAC bits in each array (e.g., DAC bit 40R in array 30), so that the currents flowing through each DAC bit in a particular array are essentially equal. Process variations in array 30 will be compensated for by placement of circuit 60 in the center of array 30. Likewise, variations in array 31 will be compensated for by placement of circuit 60 in the center of array 31. And, variations in array 32 will be compensated for by placement of circuit 60 in the center of array 32. Additionally, the same current should flow in DAC bits 40R and 40B because circuit 60 in array 30 will match bit 40R and circuit 60 in array 32 will match bit 40B with respect to process variations. If only one circuit 60 was shared between arrays 30, 31, and 32, then process variations within the IC could cause different currents to flow through DAC bits 40R and 40B. Consequently, different currents within the various DAC bits will cause the output of DAC 11 to be undesirably inconsistent.

Figure 4:
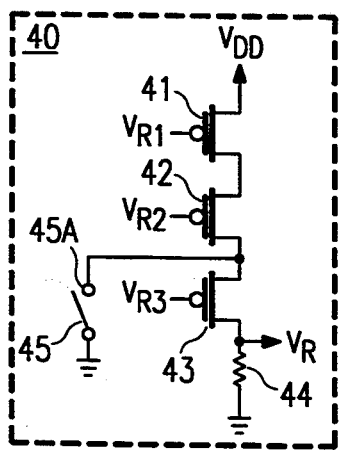
FIG. 4 illustrates a circuit diagram of a DAC cell.

Referring next to FIG. 4, there is illustrated DAC cell 40, which is the actual circuit represented by the ideal circuit employing device 23 in FIG. 2. Three voltages are used in DAC cell 40: $V_{R1}$, $V_{R2}$ and $V_{R3}$. These voltages are set up such that devices 41, 42 and 43 remain constantly saturated and, hence, a control current flows through DAC cell 40. It is critical within DAC cell 40 that voltages $V_{R1}$, $V_{R2}$ and $V_{R3}$ stay constant and that they are immune from noise generated in any of the adjoining digital circuitry within DAC 11.

Several standard layout methods are commonly implemented to shield noise emanating from adjoining digital circuitry from the reference circuit. For example, no digital transmission lines will be aligned next to analog lines on the same processing level where possible. Second, analog lines and digital lines will not cross. Third, in the case of a digital line crossing an analog line, shielding may be used utilizing an intermediate layer, which is grounded. And, fourth, in the case of a digital line aligned next to an analog line, an additional grounded wire may be added in-between the two lines for shielding.

Figure 5:
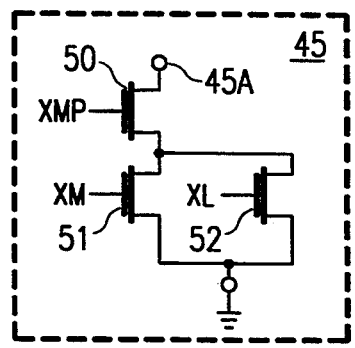
FIG. 5 illustrates a circuit diagram of switch 45 employed within the DAC cell illustrated in FIG. 4.

Switch 45, which is detailed in FIG. 5 as implemented in MOS devices, is employed to turn DAC cell 40 on or off. When switch 45 is open, current will flow through device 43 to resistor 44 resulting in voltage $V_R$ at the output of cell 40. If switch 45 is closed, (ground on terminal 45A) the source of device 43 is pulled to ground, resulting in device 43 being turned off and the current shunted through switch 45 to ground rather than to output $V_R$ (across resistor 44). Using switch 45, the current to output resistor 44 is enabled and disabled, and by doing this in a large number of bit cells like DAC cell 40, a desired voltage level can be achieved on the output of DAC 11 through $R_{OUT}$. In the preferred embodiment, devices 41, 42 and 43 are all p-channel devices. The current level flowing through cell 40 is determined by reference voltages $V_{R1}$, $V_{R2}$ and $V_{R3}$, which are coupled to reference circuit 60. In the preferred embodiment of the present invention, their coupling will result in the current I flowing through circuit 40, as shown in FIG. 2.

Referring next to FIG. 5, there is detailed switch 45 which turns on or off DAC bit (cell) Since there is generally a large number of cells 40 within DAC array 30, 31, 32, and it is preferred to have these cells 40 turned on in a predetermined fashion, three control signals are used: XL controlling device 52, XM controlling device 51 and XMP controlling device 50. Signals XL, XM and XMP control different banks within each DAC array 30, 31 and 32 and turn them on in a sequential and monotonic fashion so that the output of each array 30, 31, 32 is linear and monotonic.

The XL signal corresponds to the LSB unary bits, the XM signal corresponds to the MSB unary bits, and the XMP signal corresponds to the MSB-1 unary bits. The reader is referred to Ser. No. P3510-P13US for further discussion of these signals.

Control signals XL, XM and XMP are used in the following fashion. There are a number of columns within each DAC array 30, 31, 32. Each column contains a number of bits each identical to cell 40. Initially, if a DAC bit is off, the signal XMP will be high and the signal XL will also be high. In order to cycle up a bank of cells within a column, a number of XL signals will turn off sequentially. This presents a zero on the XL node and removes a path to ground from the source of device 43, i.e., device 51 and device 52 are both off. Once a particular column of any of arrays 30, 31, 32 is completed, i.e., all of the XL signals have gone low, then that column is said to be turned on from that point further in time. In the next column within arrays 30, 31, 32, all XL signals must go high again. Once they go high, the existing cells would turn back off again. To ensure that does not happen, the XMP signal goes low. XMP going low shuts off the path from the source of device 43 to devices 51 and 52 and ensures that all DAC bits 40 in that column stay on. XMP stands for "XM Previous" so it works in conjunction with XM. When XM for column N+1 goes low allowing XL to control cell 40, XM Previous goes to column N, because XM is low and XMP is low in column N obviously bits 40 are all turned on at all times and column N+1 since XMP is now XM from N+2, it is high and XL is allowed to control that column. This occurs in a sequential fashion across a number of columns in the area.

Referring next to FIG. 6, there is illustrated the current to voltage conversion produced within reference circuit 60, which is the actual circuit represented by the ideal circuit employing device 21 in FIG. 2. The outputs of circuit 60 are voltages $V_{R1}$, $V_{R2}$ and $V_{R3}$, which are used in DAC bit cells within arrays 30, 31, 32, such as cell 40. The current produced in source 67, a current of 2I, and the current produced in source 68, a current of I, are drawn down each leg of circuit 60. Since devices 64, 65 and 66 are p-channel devices, it is essential that they remain saturated at all times. This is achieved through the use of resistor $R_{SAFE}$, over which a small voltage $V_{SAFE}$ is dropped.

Devices 64 and 65, through which 2I is flowing, provide a voltage drop to the gate of device 62 such that the voltage across device 62 is actually $2V_T+2V_{ON}$. Referring back to DAC bit 40, which is three p-channel devices in series, a voltage $V_T+V_{ON}$ must be present across device 41, voltage $2V_T+2V_{ON}$ must be present across device 42, and an extra voltage drop must be present across device 43. The $R_{SAFE}$ device which produces $V_{SAFE}$ ensures that there is an additional voltage drop presented on $V_{R1}$ and ensures that device 41 stays on. So, essentially, the voltage produced on $V_{R1}$ is $V_{ON}$, which is the on-voltage of a p-channel device, plus $V_{SAFE}$. On $V_{R2}$ it is $2V_{ON}+V_{SAFE}$, and $V_{R3}$ would be $3V_{ON}+V_{SAFE}$, where $V_{SAFE}$ ensures again that all of the devices stay on.

Figure 7:
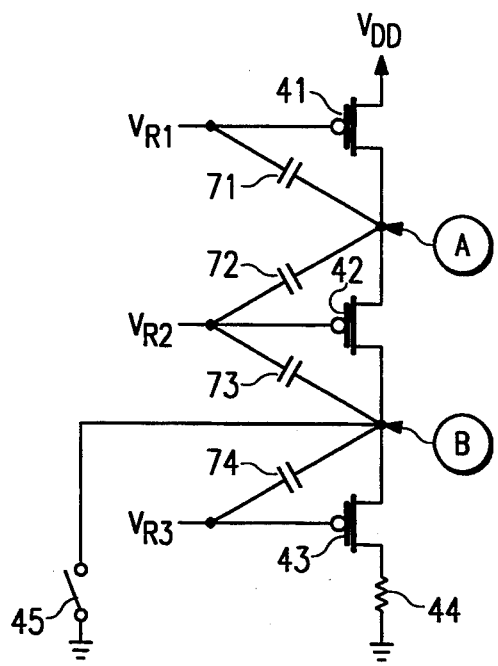
FIG. 7 illustrates inherent capacitances within the DAC cell illustrated in FIG. 4.

Referring next to FIG. 7, there is illustrated an embellished version of circuit 40 shown in FIG. 4. In addition to devices 41, 42 and 43, and switch 45, there are a number of inherent capacitances illustrated. These capacitances are inherent to a MOS device. In the preferred embodiment, the present invention is embodied within a MOS chip. However, other chip structures may be utilized.

Capacitances 71 and 73 are CGD, which refers to "capacitance gate to drain." Capacitances 72 and 74 are CGS, which refers to "capacitance gate to source." The purpose of the embellishment in FIG. 7 is to illustrate the interaction between switch 45 and devices 41, 42 and 43, which are used to switch current to output $V_R$ or to prevent current to output $V_R$. As switch 45 opens and closes, Node B will proceed from ground to some operating level. This operating level is determined by the voltages of $V_{R1}$ and $V_{R2}$. The problem is that when Node B moves the CGD of capacitances 73 and 74, CGS of $V_{R3}$ causes $V_{R2}$ and $V_{R3}$ to move. Moving these voltage levels causes the operation of the devices to vary. The variation of the operation obviously causes the current flowing through the devices to change. Furthermore, as $V_{R2}$ moves, capacitance 72 causes Node A to move. The movement on Node A is then coupled back through capacitance 71 to $V_{R1}$. It is critical that $V_{R1}$ does not move since movement of $V_{R1}$ causes device 41 to change its bias, which results in the current passing through devices 41, 42 and 44 to change.

Figure 8:
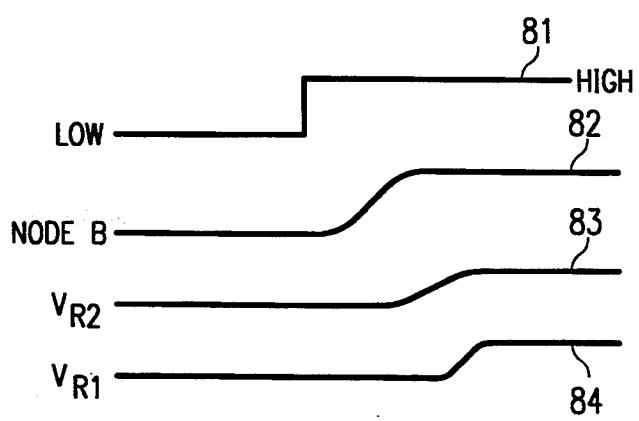
FIG. 8 illustrates the effects of the inherent capacitances illustrated in FIG. 7.

Referring to FIG. 8, signal 81 is a representation of the on/off signal of switch 45. When signal 81 is Low, switch 45 is "on," and current is being diverted through switch 45 to ground. When signal 81 is High, switch 45 is "off," and current is allowed to flow through DAC bit 40 to the output $V_R$. In the transition between Low and High, Node B will recover from a ground level to its operating level, as illustrated by signal 82. The voltage signal of $V_{R2}$, 83, is coupled-up by this transition on Node B and in turn couples-up $V_{R1}$ through capacitances 72 and 71 as illustrated by signal 84.

Figure 9:
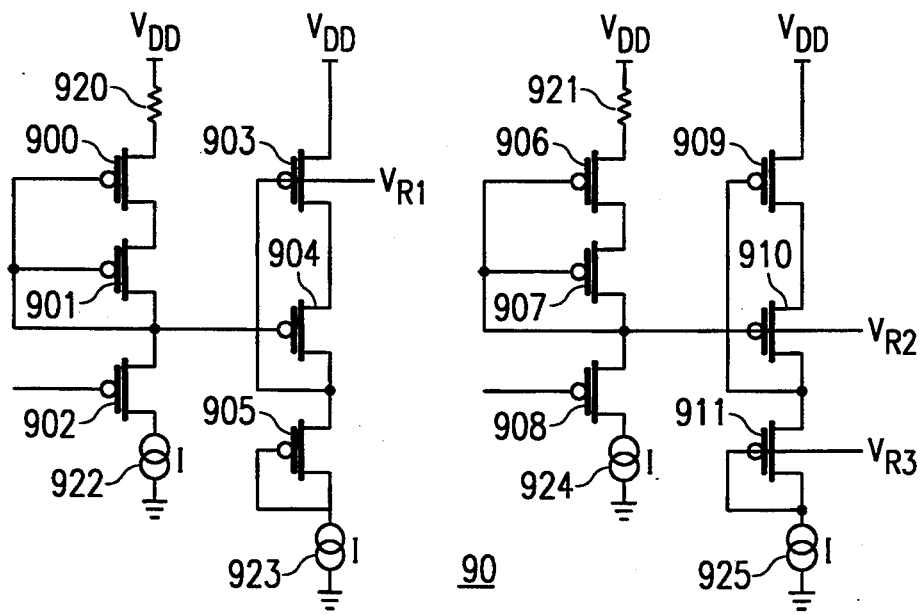
FIG. 9 illustrates a solution for removing the effects of the inherent capacitances.

Referring next to FIG. 9, there is illustrated two reference circuits (circuitry 90) which provide a solution to the problem illustrated in FIGS. 7 and 8. As previously described, it is critical that voltage $V_{R1}$ remain constant. Since a main source of coupling into $V_{R1}$ comes from capacitances 71 and 72 coupling-up $V_{R2}$, $V_{R1}$ is isolated from $V_{R2}$ by placing two current-to-voltage reference circuits (circuitry 90) in each of DAC arrays 30, 31, 32. The two circuits in circuitry 90 are analogous to circuit 60 in FIG. 6, where one of them is shown. By doing this, the capacitances shown in FIG. 7, CGS 72 and CGD 71, are eliminated between $V_{R2}$ and $V_{R1}$, hence $V_{R1}$ does not move.

The other difference between the circuits of FIG. 6 and FIG. 9 is that since there are now two separate reference circuits, instead of employing 2I current source 67 and 1I current source 68, as both are shown in FIG. 6, the 2I current has been reduced by one half, since there are two of them to share the load. Therefore, source 922 is 1I, source 923 is 1I, source 924 is 1I and source 925 is 1I. Otherwise, circuitry 90 shown in FIG. 9 functions exactly as circuit 60.

Figure 11:
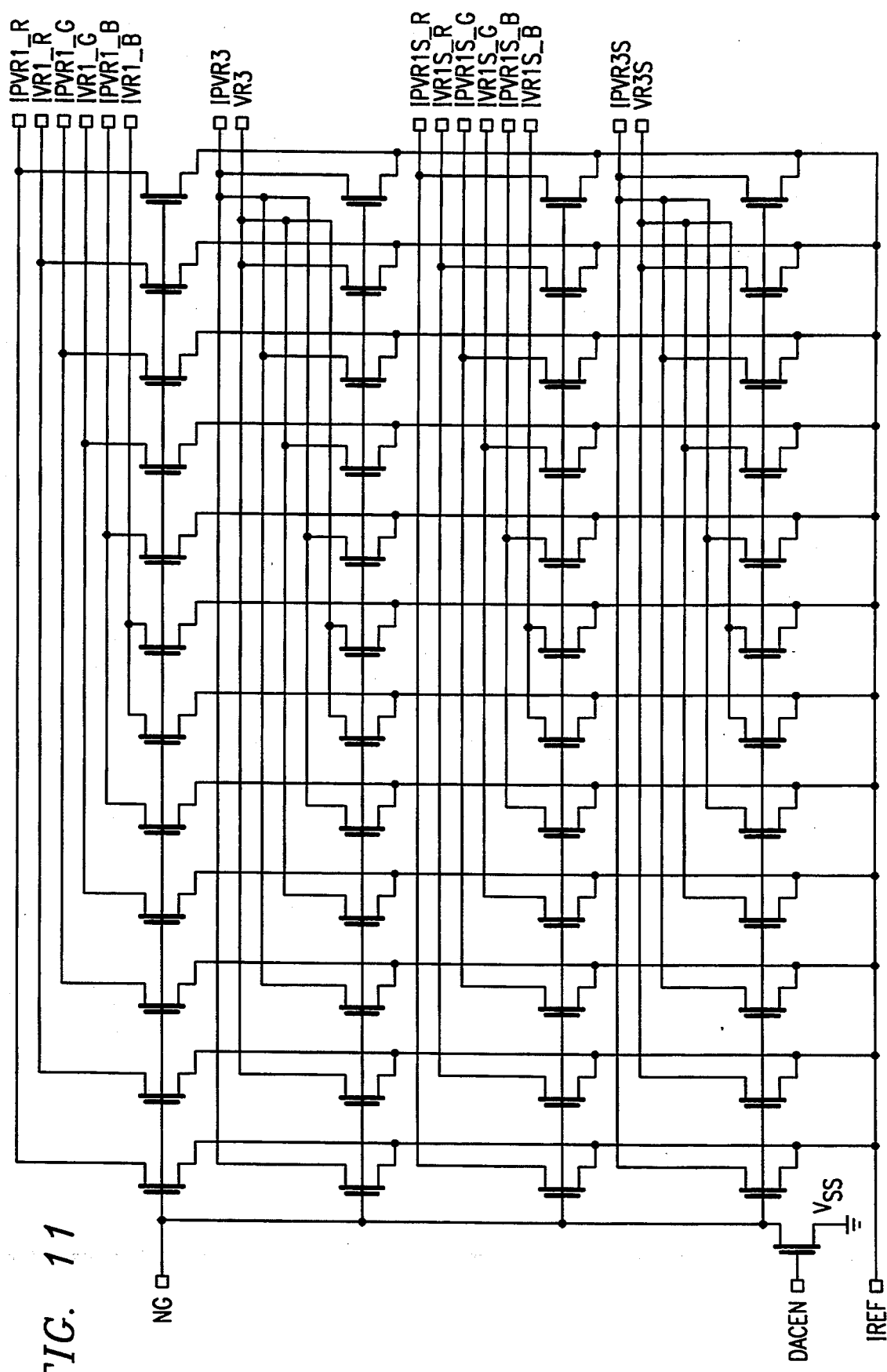
FIG. 11 illustrates a detailed circuit diagram of device 22 illustrated in FIG. 2.

Referring next to FIG. 11, there is illustrated a detailed layout of device 22 shown in FIG. 2. As described with reference to FIG. 9, circuit 60 has been divided resulting in circuitry 90, and then as shown in FIG. 3, placed within each DAC array 30, 31, 32. Each of circuits 90 requires its own current I. To accomplish this, an array of n-channel devices illustrated in FIG. 11 is constructed. The different n-channel devices provide current I to the different current-to-voltage converters (circuitry 90) within each one of DAC arrays 30, 31, 32. It is important to realize in the layout of circuit 22 that all the devices that are the same length match and that each channel—i.e., red, green and blue—has its own n-channel current sources.

The signal NG is the output of comparator 20 which feeds the gates of all the n-channel devices in circuit 22. The signal DAC enable (DACEN) is a power-on signal which, if desired, turns on causing device 110 to turn on and NG to pull low. That eliminates any current flow in DAC 11.

The signal $I_{REF}$ is the connection to the precision resistor Rp that goes to ground. The signals IPVR1_R, IVR1_R, IPVR1_G, IVR1_G, IPVR1_B, IVR1_B, IPVR3, VR3, IPVR1S_R, IVR1S_R, IPVR1S_G, IVR1S_G, IPVR1S_B, IVR1S_B, IPVR3S, and VR3S, are the current signals which are provided to circuitry 90. Circuitry 90 is implemented in two versions in each DAC array 30, 31 and 32. One of the versions supplies voltages for the regular picture bits, and the other version supplies voltages for the sync and blank bits, which are normally required within video processing systems.

With respect to the first version of circuitry 90, IPVR1_R, IPVR1_G and IPVR1_B are the currents supplied to source 922 for the red, green and blue channels, respectively. IVR1_R, IVR1_G and IVR1_B are the currents supplied to source 923 for the red, green and blue channels. IPVR3 is supplied to source 924. VR3 is the current supplied to source 925.

With respect to the second version supplying voltages for the sync and blank bits, IPVR1S_R, IPVR1S_G and IPVR1S_B are the currents supplied to source 922. Likewise, IVR1S_R, IVR1S_G and IVR1S_B are supplied to source 923. Furthermore, IPVR3S is supplied to source 924.

Though the present invention has been described with reference to processing of video signals, it may be employed with any DAC processing non-video signals.

Although the present invention and its advantages have been described in detail, it should be understood that various changes, substitutions and alterations can be made herein without departing from the spirit and scope of the invention as defined by the appended claims.

What is claimed is:

1. A circuit for supplying a reference voltage to a matrix array of DAC cells, said circuit comprising:
   means for converting a received energy source into said reference voltage, said received energy source originating from an energy supply external to said matrix array; and
   means for outputting said reference voltage to each of said DAC cells,
   wherein said circuit is located substantially within a center of said matrix array to minimize an average distance between said circuit and said DAC cells so that said outputted reference voltage is process independent.

2. The circuit as recited in claim 1, wherein said converting means further comprises:
   a plurality of MOSFET devices in series with said received energy source, said MOSFET devices supplying a plurality of reference voltages for said DAC cells.

3. The circuit as recited in claim 2 wherein said converting means further comprises:
   a second circuit of a plurality of MOSFET devices, said second circuit coupled to said received energy source, and said second circuit supplying at least one of said plurality of reference voltages to remove any coupling of said at least one of said plurality of reference voltages from the remaining reference voltages resulting from inherent capacitances within said MOSFET devices.

4. The circuit as recited in claim 2 wherein said MOSFET devices are p-channel devices.

5. The circuit as recited in claim 1 wherein said received energy source is a current received from a current source external to said matrix array.

6. The circuit as recited in claim 5 wherein said current source further comprises:
means for producing said current from a received external voltage and an external precision resistor; and
means for regulating said current by comparing said received external voltage to a second reference voltage produced by said current, wherein said producing means comprises an n-channel device in order to reference said current to ground.

7. The circuit as recited in claim 1 wherein said reference voltage is employed by said DAC cells to output an analog energy signal that is a function of a digital signal inputted to said matrix array.

8. The circuit as recited in claim 7 wherein said digital signal is a unary valued signal produced from a monotonicity circuit coupled to said matrix array.

9. The circuit as recited in claim 7 wherein said analog energy signal represents a video signal.

10. The circuit as recited in claim 7 wherein said analog energy signal represents a color of a video signal.

11. A circuit for supplying a reference energy source to a plurality of devices within an IC, said circuit comprising:
means for converting a received energy source into said reference energy source, said received energy source originating from an energy supply external to said IC; and
means for outputting said reference energy source to each of said plurality of devices,
wherein said circuit is located substantially within a center of said IC to minimize an average distance between said circuit and said plurality of devices so that said outputted reference energy source is process independent.

12. The circuit as recited in claim 11 wherein said plurality of devices are DAC cells arranged in a matrix array.

13. The circuit as recited in claim 12 wherein said circuit is located substantially in a center of said matrix array.

14. The circuit as recited in claim 11 wherein said circuit is comprised of a plurality of p-channel devices coupled to said received energy source.

15. The circuit as recited in claim 11 wherein said received energy source is a current source.

16. The circuit as recited in claim 11 wherein said reference energy source is a voltage source.

17. A video DAC comprising:
means for receiving a digital video signal separated into red, green and blue channels;
a matrix array of DAC cells for said red channel;
a matrix array of DAC cells for said green channel;
a matrix array of DAC cells for said blue channel;
a voltage reference circuit located substantially in a center of each of said red, green and blue channel matrix arrays to minimize an average distance between said voltage reference circuit and said DAC cells so that any effects are minimized on a reference voltage outputted to said DAC cells due to process variations within an IC supporting said matrix arrays and said voltage reference circuits; and
means for outputting an analog video signal from each of said red, green and blue channel matrix arrays.

18. The video DAC as recited in claim 17 wherein said analog video signals are dependent upon said reference voltages.

19. The video DAC as recited in claim 17, further comprising:
a monotonicity circuit for converting said received digital video signal into a unary valued signal for processing by each of said matrix arrays.

20. The video DAC as recited in claim 17 wherein said voltage reference circuit converts a received current, generated externally from said video DAC, into said reference voltage.

21. The video DAC as recited in claim 17 wherein said IC is comprised of MOS devices.

22. A method for providing a reference voltage to a matrix array of DAC cells, said method comprising the steps of:
incorporating a voltage reference circuit substantially within a center of said matrix array;
coupling said voltage reference circuit to an energy supply external to said matrix array; and
coupling said voltage reference circuit to each of said DAC cells.

23. The method as recited in claim 22 wherein said voltage reference circuit produces a second reference voltage for use by said DAC cells.

24. The method as recited in claim 23 wherein said second reference voltage is isolated from said reference voltage by a division of circuits supplying said first and second reference voltages within said voltage reference circuit in order to remove coupling between said reference voltage and second reference voltage caused by inherent capacitances within devices employed with said voltage reference circuit.

25. The method as recited in claim 24 wherein said devices are MOSFET devices.

26. The method as recited in claim 25 wherein said inherent capacitances are gate-to-source and gate-to-drain capacitances.

27. The method as recited in claim 22, further comprising the steps of:
converting said received external energy source into said reference voltage; and
outputting said reference voltage to each of said DAC cells.

28. The method as recited in claim 22 wherein said matrix array of DAC cells converts a received multibit signal into an analog signal representative of said multibit signal.

29. The method as recited in claim 28 wherein said multibit signal is a unary valued signal that has been converted from a digital signal by a monotonicity circuit coupled to said matrix array.

30. The method as recited in claim 29 wherein said digital signal is a video digital signal and said analog signal is a video analog signal.

31. The method as recited in claim 30 wherein said video digital and analog signals represent a video color.

32. A method for supplying an IC process variation independent reference energy source to a plurality of devices within an IC, said method comprising the steps of:

embedding an energy reference circuit substantially within a center of said IC to minimize an average distance between said energy reference circuit and said plurality of devices so that any effects are minimized on said reference energy source outputted to said plurality of devices due to process variations within said IC;

converting a received energy source into said reference energy source, said received energy source originating from an energy supply external to said IC; and outputting said reference energy source to each of said plurality of devices.

33. The method as recited in claim 32 wherein said plurality of devices are DAC cells arranged in a matrix array.

34. The method as recited in claim 33 wherein said reference energy circuit is located substantially in a center of said matrix array.

35. The method as recited in claim 32 wherein said reference energy circuit is comprised of a plurality of p-channel devices coupled to said received energy source.

36. The method as recited in claim 32 wherein said received energy source is a current source.

37. The method as recited in claim 32 wherein said reference energy source is a voltage source.

38. The method as recited in claim 32 wherein said IC is comprised of three matrix arrays of DAC cells, each of said three matrix arrays providing a digital to analog conversion of a color channel of a video signal, and wherein said reference energy source is located substantially in a center of each matrix array.

39. A method for removing coupling of gate voltages between MOS p-channel devices connected in series, said devices incorporated within a voltage reference circuit supplying two reference voltages to a matrix array of a video DAC, said method comprising the steps of:

incorporating a first circuit within an IC supporting said matrix array, said first circuit supplying one of said two reference voltages; and incorporating a second circuit within said IC, said second circuit supplying a second of said two reference voltages, wherein said first and second circuits are electrically isolated from each other.

40. The method as recited in claim 39 wherein said first and second circuits are located substantially within a center of said matrix array.

41. The method as recited in claim 39 wherein said coupling of gate voltages is a result of inherent capacitances between a gate and a source and between said gate and a drain of said MOS p-channel devices.

42. A DAC, comprising:
    a matrix array of DAC cells; and
    an energy reference circuit located substantially within a center of said matrix array, said circuit supplying a reference energy source to each of said DAC cells.

43. The DAC as recited in claim 42 wherein said DAC is a video DAC for converting received digital video signals into analog video signals.

44. The DAC as recited in claim 42 wherein said energy reference circuit is a voltage reference circuit and said energy source is a voltage source.

45. The DAC as recited in claim 42 wherein said reference energy source is a current source.

46. The DAC as recited in claim 43, further comprising:

second and third matrix arrays, wherein each of said arrays converts a particular digitized color channel into an analog version; and second and third energy reference circuits located substantially within centers of said second and third matrix arrays, respectively.

47. The DAC as recited in claim 46 wherein said energy reference circuits are voltage reference circuits.

48. A circuit for supplying a plurality of reference voltages to a matrix array of video DAC cells, said circuit comprising:

a plurality of MOSFET p-channel devices in series with a received current source for converting said received current source into said reference voltages, said received current source originating from a current supply external to said matrix array; and means for outputting said reference voltages to each of said video DAC cells, wherein said circuit is located substantially within a center of said matrix array to minimize an average distance between said circuit and said video DAC cells so that any effects are minimized on said reference voltages outputted to said video DAC cells due to process variations within an IC supporting said matrix array and said circuit.

49. The circuit as recited in claim 48 wherein said reference voltages are employed by said video DAC cells to output an analog energy signal that is a function of a digital signal inputted to said matrix array.

50. The circuit as recited in claim 49 wherein said digital signal is a unary valued signal produced from a monotonicity circuit coupled to said matrix array.

51. A video DAC comprising:
    means for receiving a digital video signal separated into red, green and blue channels;
    a matrix array of DAC cells for said red channel;
    a matrix array of DAC cells for said green channel;
    a matrix array of DAC cells for said blue channel;
    a voltage reference circuit located substantially in a center of each of said red, green and blue channel matrix arrays to minimize any process variation effects on a reference voltage outputted to said DAC cells;
    means for outputting an analog video signal from each of said red, green and blue channel matrix arrays, wherein said analog video signals are dependent upon said reference voltages; and
    a monotonicity circuit for converting said received digital video signal into a unary valued signal for processing by each of said matrix arrays.

52. The video DAC as recited in claim 51 wherein said IC is comprised of MOS devices.

53. A method for providing a reference voltage to a matrix array of DAC cells, wherein said matrix array of DAC cells converts a received multibit signal into an analog signal representative of said multibit signal, said method comprising the steps of:

incorporating a voltage reference circuit substantially within a center of said matrix array to minimize an average distance between said voltage reference circuit and said DAC cells so that any effects are minimized on said reference voltage outputted to said DAC cells due to process variations within an IC supporting said matrix array and said voltage reference circuit, wherein said voltage reference circuit produces a second reference voltage for use by said DAC cells;

coupling said voltage reference circuit to an energy supply external to said matrix array;

coupling said voltage reference circuit to each of said DAC cells;

isolating said second reference voltage from said reference voltage by dividing said voltage reference circuit in order to remove coupling between said reference voltage and second reference voltage caused by inherent capacitances within devices employed with said voltage reference circuit, wherein said inherent capacitances are gate-to-source and gate-to-drain capacitances;

converting said received external energy source into said reference voltages; and outputting said reference voltages to each of said DAC cells.

54. The method as recited in claim 53 wherein said devices are MOSFET devices.

55. The method as recited in claim 53 wherein said multibit signal is a unary valued signal that has been converted from a digital signal by a monotonicity circuit coupled to said matrix array.

56. The method as recited in claim 55 wherein said digital signal is a video digital signal and said analog signal is a video analog signal.

57. The method as recited in claim 56 wherein said video digital and analog signals represent a video color.

58. A video DAC for converting received digital video signals into analog video signals, comprising:
a plurality of matrix arrays of video DAC cells; and
a plurality of voltage reference circuits located substantially within a center of each of said matrix arrays, said circuits supplying a reference voltage to each of said DAC cells within each of said matrix arrays, wherein each of said arrays converts a particular digitized color channel into an analog version.

59. A method of making an IC having a process variation independent reference energy source supplying a plurality of devices thereon, said method comprising the steps of:
constructing said plurality of devices within a substrate material of said IC, said devices arranged in groupings; and
constructing a plurality of energy reference circuits, each said circuit constructed substantially within a center of one of said plurality of said device groupings within said substrate material of said IC.

60. The method as recited in claim 59 wherein each of said plurality of said device groupings is a matrix array of DAC cells.

61. The method as recited in claim 60 wherein each of said matrix arrays of DAC cells provides a monotonistic output.

62. The method as recited in claim 61 wherein said device groupings comprise three matrix arrays of DAC cells, one each for converting a digital video signal separated into red, green and blue channels.

63. A circuit for supplying reference voltages to a matrix array of DAC cells, said circuit comprising:
first, second and third p-channel devices coupled in series, wherein a source of said first p-channel device is coupled to a voltage supply through a resistor and a drain of said first p-channel device is coupled to a source of said second p-channel device, and wherein gates of said first and second p-channel devices are coupled to a drain of said second p-channel device, said drain of said second p-channel device coupled to a source of said third p-channel device, and wherein a drain of said third p-channel device coupled to an external current source; and fourth, fifth and sixth p-channel devices coupled in series, wherein a source of said fourth p-channel device is coupled to said voltage supply and a drain of said fourth p-channel device is coupled to a source of said fifth p-channel device, and wherein a drain of said fifth p-channel device is coupled to a source of said sixth p-channel device, and wherein a drain of said sixth p-channel device is coupled to said external current source, and wherein a gate of said fourth p-channel device is coupled to said drain of said fifth p-channel device, and wherein a gate of said sixth p-channel device is coupled to said drain of said sixth p-channel, and wherein said source of said third p-channel device is coupled to a gate of said fifth p-channel device, wherein said reference voltages are voltages supplied to said gates of said fourth, fifth and sixth p-channel devices, wherein said circuit is located substantially within a center of said matrix array to minimize any effects upon said reference voltages supplied to said DAC cells resulting from process variations within an IC supporting said matrix array and said circuit.

64. A circuit for supplying reference voltages to a matrix array of DAC cells, said circuit comprising:
first, second and third p-channel devices coupled in series between a voltage supply and an supplied current source, wherein gates of said first and second devices are both coupled to a junction of a drain of said second device and a source of said third device;

fourth, fifth and sixth p-channel devices coupled in series between said voltage supply and said current source, wherein said junction is coupled to a gate of said fifth device, and wherein a gate of said sixth device is coupled to a drain of said sixth device, and wherein a gate of said fourth device is coupled to a drain of said fifth device, wherein a first voltage present at said gate of said fourth device is a first reference voltage supplied to said matrix array;

seventh, eighth and ninth p-channel devices coupled in series between said voltage supply and said current source, wherein gates of said seventh and eighth devices are both coupled to a drain of said eighth device; and tenth, eleventh and twelfth p-channel devices coupled in series between said voltage supply and said current supply, wherein a gate of said tenth device is coupled to a source of said twelfth device, and wherein a gate of said twelfth device is coupled to a drain of said twelves device, and wherein a gate of said eleventh device is coupled to said drain of said eighth device, wherein a second voltage present at said gate of said eleventh device is a second reference voltage supplied to said matrix array, and wherein a third voltage present at said gate of said twelfth device is a third reference voltage supplied to said matrix array.

* * * * *